United States Patent [19]
Raghavan et al.

[11] Patent Number: 5,512,318
[45] Date of Patent: Apr. 30, 1996

[54] METHOD FOR PREPARING SURFACES WITH AN ULTRAHIGH-PRESSURE FAN JET

[75] Inventors: Chidambaram Raghavan, Kent; Steven S. Sisson, Normandy Park; Richard F. Schmid, King, all of Wash.

[73] Assignee: Flow International Corporation, Kent, Wash.

[21] Appl. No.: 412,541

[22] Filed: Mar. 29, 1995

[51] Int. Cl.$^6$ .............................. B05D 7/22; B05D 3/12
[52] U.S. Cl. ................... 427/230; 427/290; 427/299; 427/444
[58] Field of Search .................... 427/290, 299, 427/444, 230

[56] References Cited

U.S. PATENT DOCUMENTS

| | | | |
|---|---|---|---|
| 4,877,638 | 10/1989 | Novar | 427/299 |
| 5,080,056 | 1/1992 | Kramer et al. | 123/193 |
| 5,271,967 | 12/1993 | Kramer et al. | 427/455 |
| 5,316,786 | 5/1994 | Lippe et al. | 427/299 |
| 5,380,564 | 1/1995 | VanKuiken, Jr. et al. | 427/456 |

OTHER PUBLICATIONS

Veltrup, E. M., "Experience of the Industrial Application of HP–Water Technology for Stripping Down Rubber Layers from Rubber Rollers," *Fifth International Symposium on Jet Cutting Technology;* organized and sponsored by BHRA Fluid Engineering, Jun. 2–Jun. 4, 1980, Paper H2, pp. 377–384.

Kratochvil, W. R. and J. M. Sohr, "Removal of Thermal Spray Coatings with Ultra High Pressure Water Jets," *Proceedings of the International Thermal Spray Conference & Exposition,* Orlando, Florida, USA, May 28–Jun. 5, 1992, pp. 285–291.

Sanders, M. J. and R. D. Bond, "The Use of High Pressure Water Jetting to Remove the Corrosion Deposit From Samples of the WSGHWR Primary Circuit Pipework," *Seventh International Symposium on Jet Cutting Technology,* Jun. 26–Jun. 28, 1984, Paper C1, pp. 99–118.

Haferkamp, H., H. Louis and W. Schikorr, "Jet–Cleaning Investigations on Polymeric Model Layers," *Seventh International Symposium on Jet Cutting Technology,* Jun. 26–Jun. 28, 1984, Paper C2, pp. 119–134.

Louis, H. and W. Schikorr, "Fundamental Aspects in Cleaning with High–Speed Water Jets," *Sixth International Symposium on Jet Cutting Technology,* organized and sponsored by BHRA Fluid Engineering, Apr. 6–Apr. 8, 1982, Paper E3, pp. 217–228.

Vickers, G. W., P. W. Harrison and R. Houlston, "Extending the Range of Cavitation Cleaning Jets," *Fifth International Symposium on Jet Cutting Technology,* Jun. 2–Jun. 4, 1980, Paper J1, pp. 403–412.

Haferkamp, H., H. Louis, P. T. Tai and T. Wehlage, "Detection and Evaluation of Cavitation Damages by Roughness Measurement in Their Early Stages," *Proceedings of the Seventh International Conference on Erosion by Liquid and Solid Impact,* (no date).

Saunders, D. H. and R. E. P. Barton, "The Use of Fan–Shaped Water Jets in Perference to Straight Jets to Remove a Paint Coating," *Eighth International Symposium on Jet Cutting Technology,* Durham, England, Sep. 9–Sep. 11, 1986, Paper 37, pp. 353–361.

*Primary Examiner*—Janyce Bell
*Attorney, Agent, or Firm*—Seed and Berry

[57] ABSTRACT

A method for uniformly roughening a surface through use of an ultrahigh-pressure fluid fan jet has been shown and described. In a preferred embodiment, an ultrahigh-pressure fan jet is generated by pressurizing a volume of fluid, and forcing the pressurized fluid through a fan jet nozzle. The fan jet is positioned relative to the surface to be treated at a desired distance, and the fan jet is traversed across the surface at a selected rate to uniformly roughen the surface. In a preferred embodiment, the achieved surface roughness is quantified and compared to a desired surface finish. Operating parameters, such as horsepower and traverse rate, may then be adjusted accordingly to achieve the desired surface finish. By uniformly and completely roughening a surface through use of an ultrahigh-pressure fan jet prior to applying a coating to the roughened surface, adherence between the surface and the coating will be improved.

15 Claims, 4 Drawing Sheets

METHOD FOR PREPARING SURFACES WITH AN ULTRAHIGH-PRESSURE FAN JET

TECHNICAL FIELD

This invention relates to the preparation of surfaces and, more particularly, to the preparation of surfaces through use of an ultrahigh-pressure fluid fan jet.

BACKGROUND OF THE INVENTION

In various contexts where a coating is applied to a surface, it is often desirable to roughen the surface prior to applying the coating, to thereby increase the adhesion between the surface and coating. Examples of such situations include the application of paint to an aircraft or plasma sprayed coatings to vehicle or aircraft engine pans, and chemical plating. It may also be desirable to roughen a surface to prepare it for other uses, for example, in a chemical reaction. This is due to the fact that roughening a surface effectively increases the surface area of the given surface, thereby accelerating reaction times.

Currently available systems for preparing a surface to receive a coating include the use of chemicals, grit blasting, and sandpaper. However, these methods are cumbersome, expensive, and produce wastes that are becoming more and more unacceptable, given environmental concerns.

An alternative, currently available system uses ultrahigh-pressure fluid round jets to roughen a surface. However, such systems provide less than optimal results, given that it is often necessary and desirable to uniformly roughen 100% of a surface. The performance of a round jet is limited because it has a circular cross-section and it is therefore necessary to move the round jet in a circular pattern in an attempt to roughen the entire surface. Rotating a round jet is equivalent to moving a point, however, and as a result, the movement of the round jet over a surface may produce a pattern in which some areas on the surface are hit multiple times while other areas of various shapes are not hit at all by the jet. The surface may therefore not be uniformly roughened.

A need therefore exists for an improved method for preparing surfaces to receive a coating or to be used in some other manner.

SUMMARY OF THE INVENTION

It is therefore an object of this invention to provide an improved method of preparing surfaces.

It is another object of this invention to provide a method for uniformly roughening a surface.

It is another object of this invention to provide a method for uniformly roughening a surface that is reliable and efficient to use.

These and other objects of the invention, as will be apparent herein, are accomplished by treating a surface with an ultrahigh-pressure fluid fan jet. In a preferred embodiment, an ultrahigh-pressure fluid fan jet is generated by pressurizing a volume of fluid and forcing the pressurized fluid through a fan jet nozzle, such as those manufactured by Flow International Corporation. The pressurized fluid is forced through the nozzle at a selected flow rate and pressure. The fan jet nozzle is positioned relative to the surface to be treated, such that an exit orifice of the nozzle is 0.25–2.0 inches from the surface. This distance is referred to as the standoff distance.

The ultrahigh-pressure fan jet is traversed across the surface at a selected rate so as to uniformly roughen the surface by eroding the surface to create peaks and valleys. It will be understood that the degree of roughness achieved is dependent on the horsepower of the fan jet, which is a function of the pressure and flow rate of the fluid provided to the nozzle, the standoff distance, the rpm if the nozzle is being rotated, the angular position of the fan jet relative to the surface, and the length of time the fan jet is in contact with the surface. These parameters will also change depending on the material of the surface being treated and the designated use of the treated surface, or the surface may be used in any other desired manner.

In order to set the operating parameters to achieve a desired degree of roughness, therefore, the fan jet is traversed across a surface at an initial set of parameters after which the achieved surface roughness is quantified and compared to the desired roughness. The fluid flow rate, pressure, nozzle standoff and fan jet traverse rate may then be adjusted as necessary to increase or decrease the surface roughness. Once the appropriate parameters are determined, and the surface is treated, a coating may be applied to the surface.

An ultrahigh-pressure fan jet may also be used to treat a surface where the surface is in the form of a cylinder. In a preferred embodiment, a fan jet nozzle is positioned relative to a cylindrical surface so that an axis of the fan jet is at an angle of 60°–80° relative to a vertical axis located at a center of the cylinder, and a plane of the fan jet is at an angle of 0°–60° relative to a vertical plane defined by the vertical axis of the cylinder and the axis of the fan jet. The fan jet nozzle is then rotated by a conventional swivel drive at a rate of 300–1,000 rpm while it is simultaneously fed into and out of the cylinder.

The fan jet has a substantially linear footprint, the width of which may be varied with changes in the geometry of the nozzle. The fan jet may therefore be swept across the surface to be treated in the direction of a minor axis of the footprint to uniformly roughen the surface, thereby avoiding the problems associated with the rotation and translation of a circular jet. Furthermore, because the fan jet provides substantially 100% coverage of the surface, a single, relatively large fan jet nozzle may be used in contrast to multiple small round jet nozzles. The fan jet may also be generated at a lower pressure and rotated at a lower rpm than a configuration of small round jets. The reliability of the system is therefore improved, given that there are fewer nozzles, a large nozzle is less likely to clog than small nozzles, and the life of the swivel and pump components is significantly increased when the system components are operated at a lower rpm and pressure.

DETAILED DESCRIPTION OF THE INVENTION

In a variety of situations in which a coating is applied to a surface, it is often desirable to first roughen the surface to be coated, thereby improving the adhesion between the coating and surface. In the current state of the art, this surface preparation or roughening is accomplished through use of chemicals, grit blasting, sandpaper, or ultrahigh-pressure round jets. While the use of ultrahigh-pressure round jets eliminates the inconvenience and waste products generated by the use of chemicals or grit, round jets have several disadvantages. In particular, a round jet has a circular cross-section, such that rotation of a round jet is equivalent to rotating a point, making it difficult to achieve uniform and complete coverage of the surface, particularly if the surface is a hard material. As a result, some areas of the surface may be hit multiple times by the rotating round jets, while other areas are not hit at all, such that the surface is not treated completely or evenly.

Figure 1:
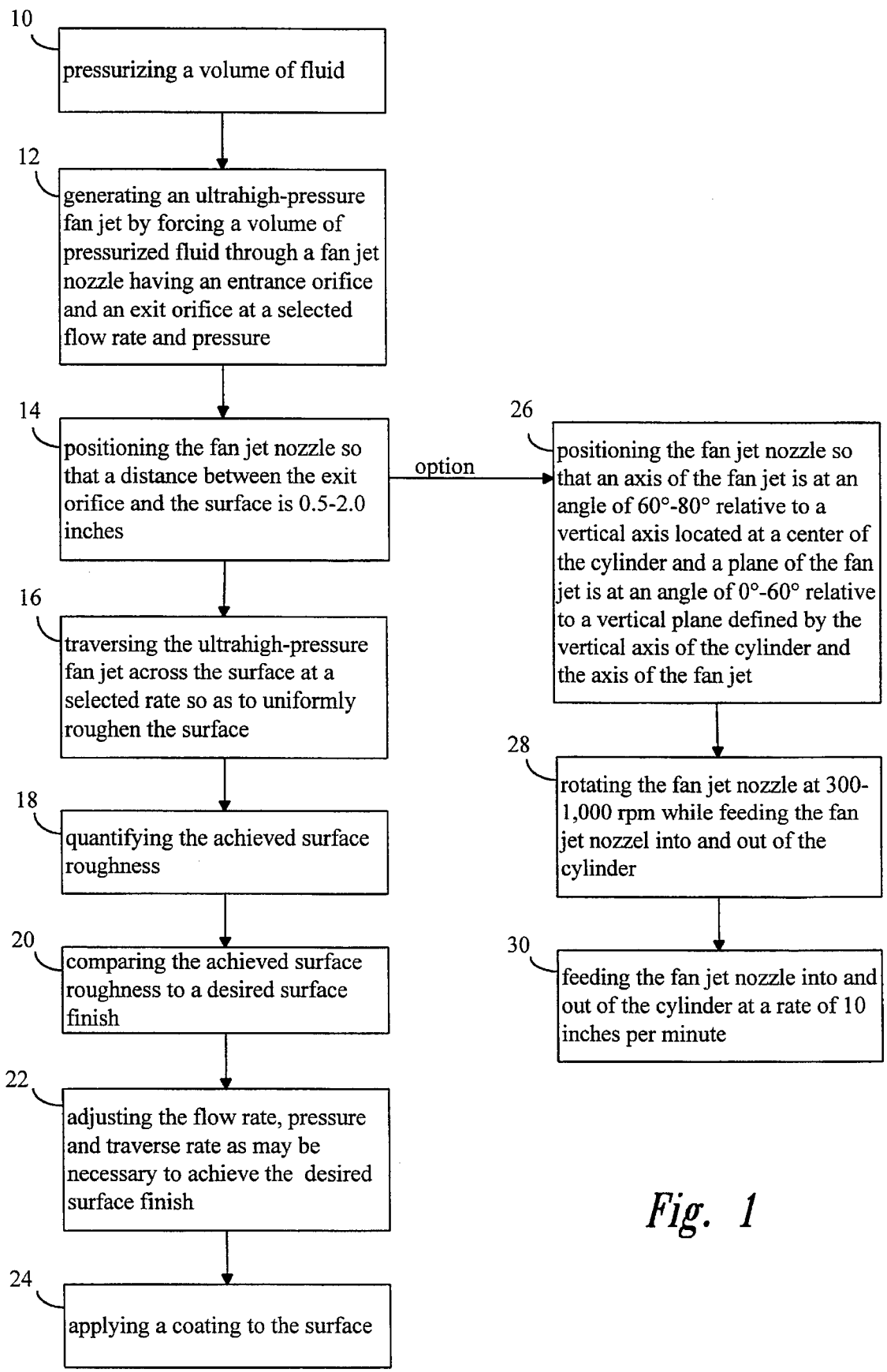
FIG. 1 is a diagram illustrating the steps of a preferred embodiment of the present invention.

In order to overcome this problem, in addition to other shortcomings that will be discussed below, a surface is prepared in accordance with a preferred embodiment of the present invention through use of an ultrahigh-pressure fluid fan jet 32. As illustrated in FIG. 1, an ultrahigh-pressure fan jet may be generated by pressurizing a volume of fluid, typically water, step 10, through the use of high-pressure intensifier pumps (not shown) such as the 20X pump manufactured by Flow International Corporation. Such pumps may pressurize fluid up to and beyond 55,000 psi. The ultrahigh-pressure fan jet 32 is generated by forcing a volume of pressurized fluid through a fan jet nozzle 34, step 12.

Figure 2:
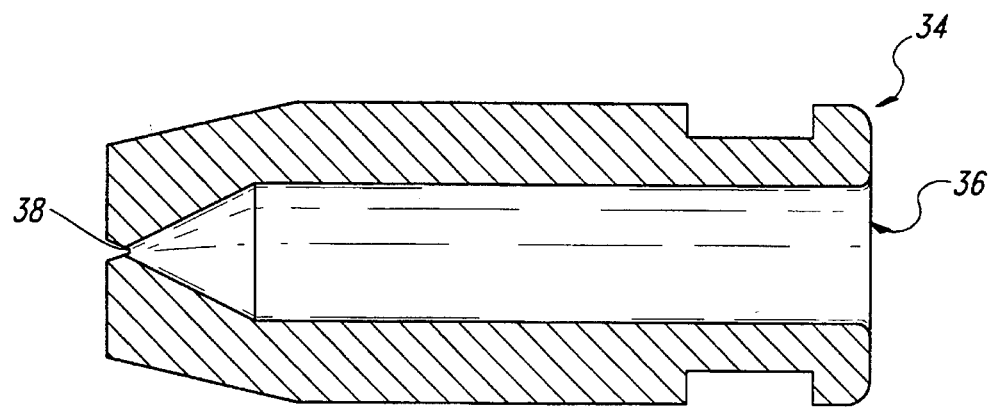
FIG. 2 is a cross-sectional view of a nozzle used in a preferred embodiment of the present invention.

As illustrated in FIG. 2, fan jet nozzle 34 has an entrance orifice 36 and exit orifice 38. In a preferred embodiment of the present invention, a fan jet nozzle manufactured by Flow International Corporation is used, the size of the fan jet nozzle ranging from −10 to −40. (The size of the fan jet nozzles are rated such that a −10 fan jet nozzle accommodates the same flow rate at the same pressure as a round jet having a diameter of 0.010 inch, a −40 fan jet nozzle accommodates the same flow rate at the same pressure as a round jet having a 0.040 inch diameter, etc.) Although a desire to treat a surface quickly suggests the use of a relatively large jet, practical concerns such as horsepower requirements, torque, operating costs,, etc. weigh against using too large of a fan jet nozzle. If the nozzles are too small, however, they are prone to clog and fail, and take longer to achieve the same task. It is therefore believed that preferred results are obtained by using a fan jet nozzle in the range of −10 to −40, with optimal results being achieved using a −17 fan jet.

Figure 3:
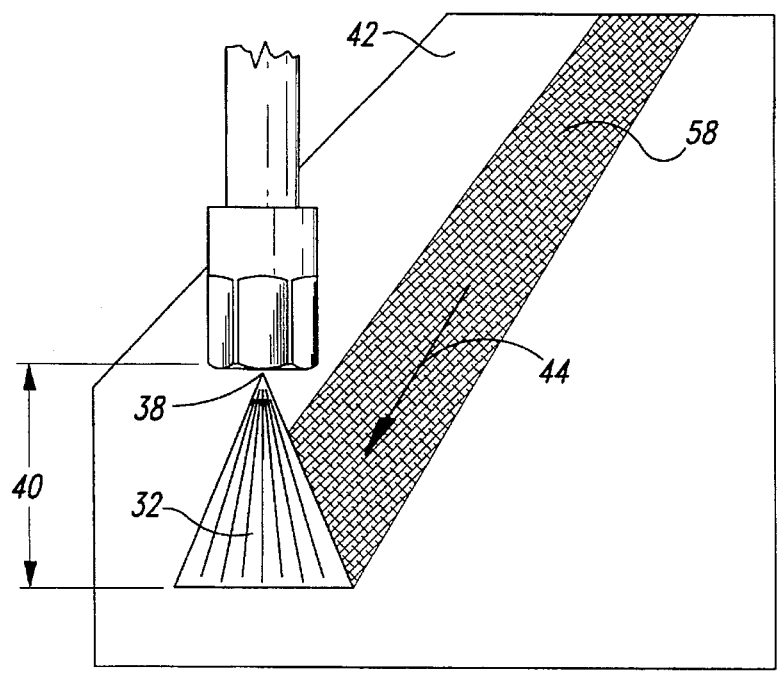
FIG. 3 is an illustration of a surface being roughened in accordance with a preferred embodiment of the present invention, using the nozzle of FIG. 2.

In a preferred embodiment of the present invention, as illustrated in FIG. 3, the fan jet nozzle 34 is positioned relative to a surface 42 to be treated, such that the standoff distance 40, or distance between the exit orifice 38 and surface 42, is 0.25–2.0 inches. This positioning of the fan jet nozzle, step 14, is believed to provide superior results, given the flow characteristics of the fan jet. Although applicants do not intend for the scope of their invention to be bound by theory, it is believed that fluid jets transition from a coherent state near the exit of a nozzle into high-velocity large droplets at some distance from the exit orifice, and that the droplets then slow down and break up at some greater distance from the exit orifice. A fluid jet may therefore be thought of as having three zones that it transitions through as it exits a nozzle, namely a coherent zone, a high-velocity large droplet zone, and a low-velocity, small droplet zone. It is believed that the contact stresses are greatest in the second zone, and that superior surface preparation results are therefore achieved by placing a surface to be treated in the second zone. While large round jets, for example those having a diameter of 0.008 inch or greater, tend to break up nonuniformly, resulting in an uneven power distribution, both small and large fan jets appear to transition uniformly and create well-defined zones. It is believed that the transition to large, high-velocity droplets in zone 2 occurs at 0.25–2.0 inches from the exit orifice 38, and the standoff distance is therefore set accordingly. It will be understood that the exact standoff will depend on the fluid pressure, flow rate and the angle of divergence of the fan jet. For example, it is believed that the distance to zone 2 is greater, the smaller the angle of divergence β of the fan jet. A fan jet having a relatively narrow angle of divergence, for example, 5°–10°, will therefore have a longer zone 1 than a fan jet having an angle of divergence of 35°–50°. The standoff will therefore be greater when using the narrower fan jet.

In a preferred embodiment, the ultrahigh-pressure fan jet 32 is traversed across the surface 42 in a direction, illustrated by reference arrow 44, at a selected rate so as to uniformly roughen the surface 42, step 16. It will be understood that the degree of roughness achieved 58 will depend on the flow rate and pressure of the fluid through the nozzle, as well as the length of time the ultrahigh-pressure fan jet 32 is in contact with surface 42. The amount of roughness achieved will also depend on the material of the surface being treated. In order to achieve a desired surface finish, therefore, it is necessary to select a fluid flow rate and pressure, which in turn determines the horsepower of the fan jet 32, as well as a traverse rate. After the fan jet 32 has traversed surface 42 at an initially selected horsepower, standoff and traverse rate, the achieved surface roughness is quantified, step 18, and compared to the desired surface finish, step 20. Although the surface finish may be quantified in a variety of ways, in a preferred embodiment, a profilometer is used to calculate a root mean square (rms) value for the surface, Rq. In an alternative embodiment, Ra, the arithmetic mean of displacement values, is calculated to quantify the degree of roughness achieved. If the achieved surface finish differs from the desired surface finish, the operating parameters, such as horsepower, standoff and traverse rate, may be adjusted accordingly to achieve the desired surface finish step 22. In a preferred embodiment, once the desired surface finish is achieved, a coating may be applied, step 24.

Figure 4:
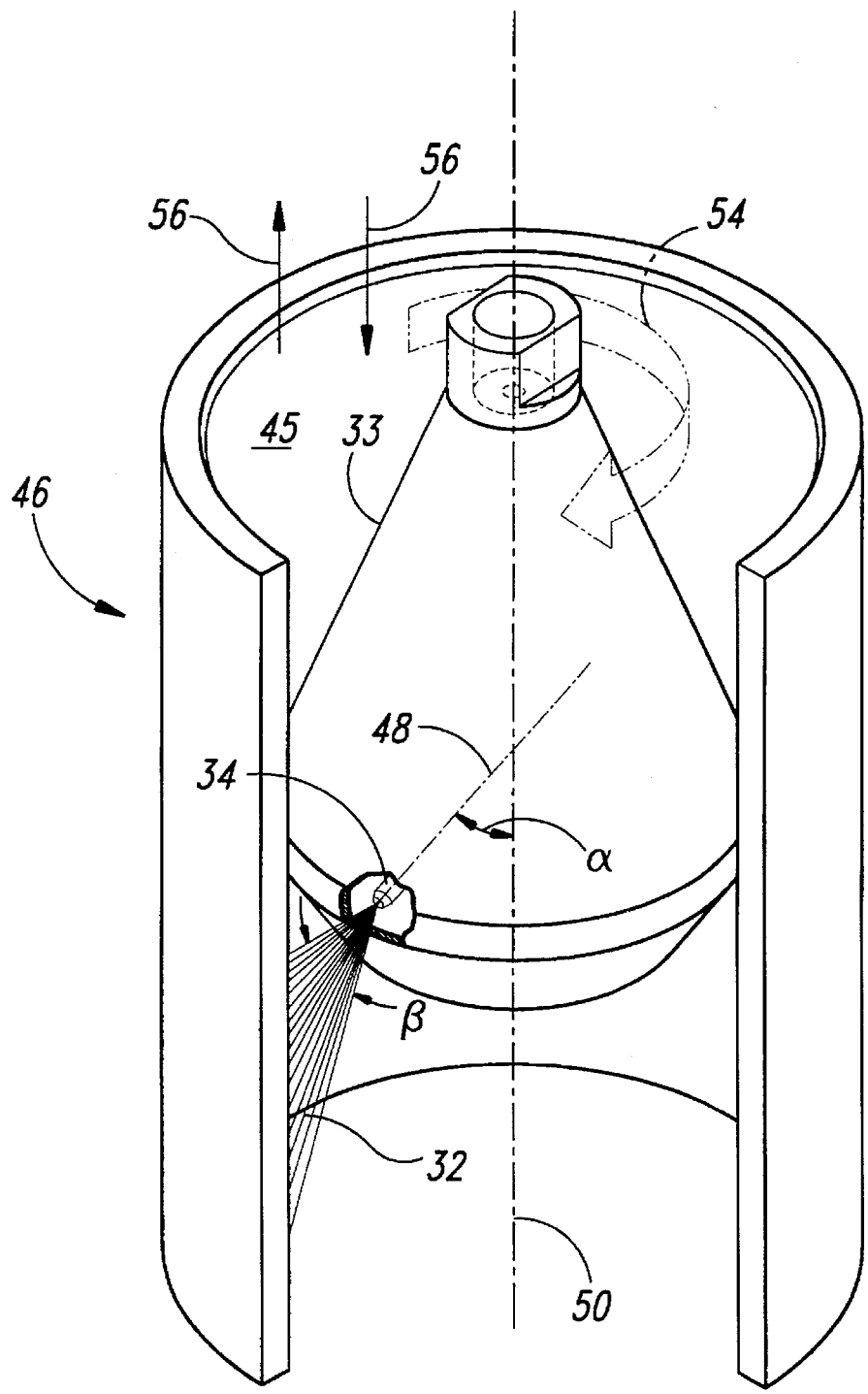
FIG. 4 is an illustration of a cylindrical surface being roughened in accordance with a preferred embodiment of the present invention, using the nozzle of FIG. 2.
Figure 6:
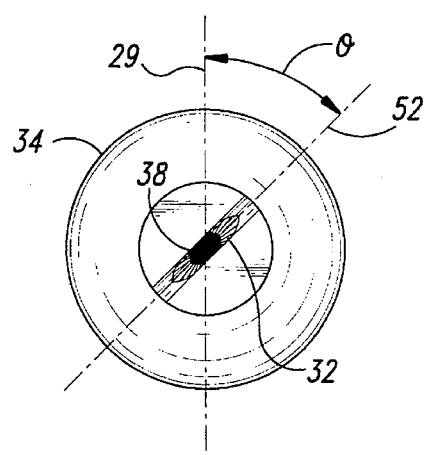
FIG. 6 is a bottom plan view of the nozzle of FIG. 1.

It will be understood that the present invention may be used to prepare surfaces of different materials and configurations. For example, the ultrahigh-pressure fan jet 32 may be used to prepare a surface 45 of a cylinder 46, as illustrated in FIG. 4. This may be accomplished by positioning the fan jet nozzle provided in housing 33 relative to the surface 45 at a standoff distance of 0.25–2.0 inches, step 26, and rotating the fan jet nozzle 34 and generated fan jet 32, step 28, as indicated by reference arrow 54. As the fan jet nozzle 34 is being rotated, it is also fed into and out of the cylinder 46, step 30, as indicated by reference arrows 56. Although the feed rate will be determined by the desired task completion time, in a preferred embodiment, the nozzle 34 is fed into and out of the cylinder at a rate of 10 inches per minute. In a preferred embodiment, the fan jet nozzle 34 is positioned such that an axis 48 of the fan jet is at an angle α of 60°–80° relative to a vertical axis 50 located at a center of the cylinder 46. As illustrated in FIG. 6, a plane 52 of the fan jet 32 is at an angle θ of 0°–60° relative to a vertical plane defined by the vertical axis 50 of the cylinder and the axis 48 of the fan jet, with preferred results occurring when θ is 45°.

The ultrahigh-pressure fan jet 32 has a substantially linear footprint, which for purposes of discussion, may be viewed as a thin rectangle, or as an oval having a very high aspect ratio, such as 100:1. If the fan jet is thought of as having a major and a minor axis, it can be seen that if the fan jet is swept across a surface to be treated in the direction of the minor axis, the fan jet will uniformly and completely cover the surface. The use of a fan jet therefore overcomes the problems associated with the rotation of the round jet. Because substantially 100% coverage can be achieved with a fan jet, it is possible to use a single nozzle, as opposed to multiple round nozzles, thereby simplifying and increasing the reliability of the system. Furthermore, whereas current systems typically use multiple, small diameter round jets having diameters in the range of 0.007 inch and smaller, a relatively large fan jet may be used, thereby also increasing the reliability of the system given that a large jet is less likely to become plugged and fail as compared to a small diameter jet. (It is believed to be undesirable to use large round jets, given their uneven power distribution due to their tendency to transition through zones nonuniformly, as discussed previously.)

It is believed that preferred results are achieved when the operating pressure of the system is between 30,000–55,000 psi. When a conventional swivel is used to rotate the fan jet nozzle to treat an inner surface of a cylinder, preferred results are achieved at 300–1,000 rpm. Again, it will be understood that the exact operating parameters will vary depending on the task at hand and the desired completion time; however, given that full and uniform coverage is achieved with a fan jet, a given task may be completed at lower pressures and low rpms compared to a system using round jets. For example, a single −17 fan jet operated at 40,000 psi and 300 rpm will achieve superior results than those achieved through use of eight −5 round jets operated at 55,000 psi and 1,000 rpm, both systems being operated at the same horsepower. Given the ability to operate at lower pressures and rpms, the life of the swivel and pump components is increased, thereby increasing the reliability of the system and reducing operating costs. Operating costs are also reduced by the ability to operate at lower nozzle horsepower. Most significantly, however, is the superior surface finish that is achieved in accordance with the preferred embodiment of the present invention, given that the surface will be uniformly and completely roughened. In a preferred embodiment, this uniform surface treatment results in better adhesion between the surface and a coating.

Figure 5:
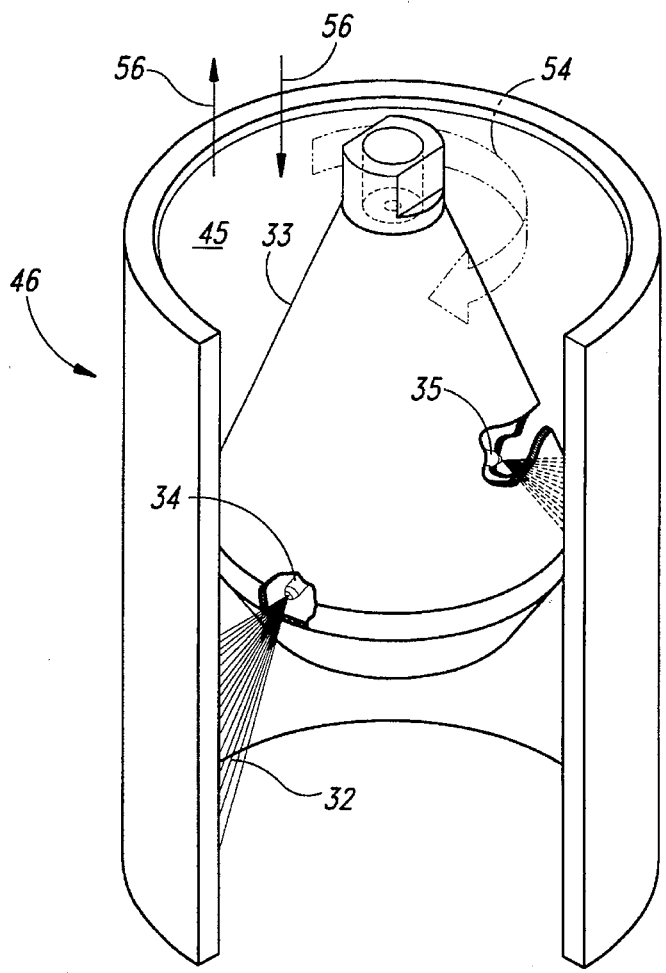
FIG. 5 is an illustration of a cylindrical surface being roughened in accordance with a preferred embodiment of the present invention using multiple fan jet nozzles.

In an alternative embodiment, more than one nozzle may be used to treat a given surface. For example, as illustrated in FIG. 5, a second fan jet nozzle 35 is provided in housing 33, spaced 180° from the first fan jet nozzle 34. As a result, the unbalanced thrust force created by a single fan jet will be reduced which, particularly at a higher operating horsepower, will increase the reliability of the system. The use of more than one nozzle is also beneficial when operating at a higher horsepower because it is more practical and efficient to divide a high flow rate through two or more nozzles rather than force the same flow rate through a single nozzle. For example, if a flow rate of 4.8 gallons/minute is used, it is believed to be beneficial to use 2, −24 nozzles and accommodate 2.4 gallons/minute through each of the nozzles, rather than use 1, −34 nozzle, given that a desired surface roughness can be achieved at a faster traverse rate.

The method of surface preparation described herein may be used in any situation where it is desired to increase the effective surface area of a given surface. For example, chemical reaction time may be sped up by roughening a surface in accordance with the present invention, for example, a catalytic surface.

A method for preparing a surface through use of an ultrahigh-pressure fluid fan jet has been shown and described. From the foregoing, it will be appreciated that, although embodiments of the invention have been described herein for purposes of illustration, various modifications may be made without deviating from the spirit and scope of the invention. Thus, the present invention is not limited to the embodiments described herein, but rather is defined by the claims which follow.

We claim:

1. A method for preparing a surface to receive and adhere to a coating comprising:

generating an ultrahigh-pressure fan jet by forcing a volume of pressurized fluid through a fan jet nozzle having an entrance orifice and an exit orifice, at a pressure of at least 30,000 psi;

positioning the fan jet nozzle so that a distance between the exit orifice and the surface is 0.25–2.0 inches; and traversing the ultrahigh-pressure fan jet across the surface so as to uniformly roughen the surface.

2. The method according to claim 1, further comprising:

quantifying a achieved surface roughness;

comparing the achieved surface roughness to a first, quantified surface roughness; and adjusting a flow rate and a traverse rate as may be necessary such that the achieved surface roughness is the same as the first, quantified surface roughness.

3. The method according to claim 1 wherein the pressurized fluid is at a pressure of 30,000–55,000 psi.

4. The method according to claim 1 wherein a fluid flow rate through the fan jet at a pressure is equivalent to the flow rate through a round jet nozzle having a diameter of 0.010–0.040 inch at the pressure.

5. The method according to claim 1 wherein the surface is a cylinder, and the method further comprises:

positioning the fan jet nozzle so that an axis of the fan jet is at an angle of 60°–80° relative to a vertical axis located at a center of the cylinder and a plane of the fan jet is at an angle of 0°–60° relative to a vertical plane defined by the vertical axis of the cylinder and the axis of the fan jet; and rotating the fan jet nozzle at 300–1,000 rpm while feeding the fan jet nozzle into and out of the cylinder.

6. The method according to claim 1 wherein the pressurized fluid is at 40,000 psi and is forced through the fan jet nozzle at 1.2 gallons per minute.

7. A method for coating a surface comprising:

pressurizing a volume of fluid to a pressure of at least 30,0000 psi;

generating an ultrahigh-pressure fan jet by forcing the volume of pressurized fluid through a fan jet nozzle having an entrance orifice and an exit orifice;

positioning the fan jet nozzle so that a distance between the exit orifice and the surface is 0.25–2.0 inches;

traversing the ultrahigh-pressure fan jet across the surface so as to uniformly roughen substantially all of the surface; and applying a coating to the surface.

8. The method according to claim 7 wherein the pressurized fluid is at a pressure of 30,000–55,000 psi.

9. The method according to claim 7 wherein a fluid flow rate through the fan jet at a pressure is equivalent to the flow rate through a round jet nozzle having a diameter of 0.010–0.040 inch at the pressure.

10. The method according to claim 7 wherein the surface is a cylinder, and the method further comprises:

positioning the fan jet nozzle so that an axis of the fan jet is at an angle of 60°–80° relative to a vertical axis located at a center of the cylinder and a plane of the fan jet is at an angle of 0°–60° relative to a vertical plane defined by the vertical axis of the cylinder and the axis of the fan jet; and rotating the fan jet nozzle at 300–1,000 rpm while feeding the fan jet nozzle into and out of the cylinder.

11. A method for increasing the effective surface area of a surface comprising:

pressurizing a volume of fluid to a pressure of at least 30,000 psi;

generating an ultrahigh-pressure fan jet by forcing the volume of pressurized fluid through a fan jet nozzle having an entrance orifice and an exit orifice;

positioning the fan jet nozzle so that a distance between the exit orifice and the surface is 0.25–2.0 inches; and traversing the ultrahigh-pressure fan jet across the surface so as to uniformly roughen substantially all of the surface.

12. The method according to claim 11 wherein the pressurized fluid is at a pressure of 30,000–55,000 psi.

13. The method according to claim 11 wherein a fluid flow rate through the fan jet at a pressure is equivalent to the flow rate through a round jet nozzle having a diameter of 0.010–0.040 inch at the pressure.

14. The method according to claim 11 wherein the surface is a cylinder, and the method further comprises:

positioning the fan jet nozzle so that an axis of the fan jet is at an angle of 60°–80° relative to a vertical axis located at a center of the cylinder and a plane of the fan jet is at an angle of 0°–60° relative to a vertical plane defined by the vertical axis of the cylinder and the axis of the fan jet; and rotating the fan jet nozzle at 300–1,000 rpm while feeding the fan jet nozzle into and out of the cylinder.

15. A method for treating an inner surface of a cylinder comprising:

generating a first ultrahigh-pressure fan jet by forcing a volume of pressurized fluid through a first fan jet nozzle having an entrance orifice and an exit orifice, at a pressure of at least 30,000 psi;

positioning the first fan jet nozzle so that an axis of the first fan jet is at an angle of 60°–80° relative to a vertical axis located at a center of the cylinder and a plane of the first fan jet is at an angle of 0°–60° relative to a vertical plane defined by the vertical axis of the cylinder and the axis of the first fan jet; and generating a second ultrahigh-pressure fan jet by forcing a volume of pressurized fluid through a second fan jet nozzle having an entrance orifice and an exit orifice, at a pressure of at least 30,000 psi;

positioning the second fan jet nozzle so that the second ultrahigh-pressure fan jet is opposite to the first fan jet; and rotating the first and second fan jet nozzles at 300–1,000 rpm while feeding the first and second fan jet nozzles into and out of the cylinder.

* * * * *